United States Patent
Marsh (12)

(10) Patent No.: US 6,281,161 B1
(45) Date of Patent: *Aug. 28, 2001

(54) PLATINUM-CONTAINING MATERIALS AND CATALYSTS

(75) Inventor: Eugene P. Marsh, Boise, ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 3 days.

(21) Appl. No.: 09/399,591

(22) Filed: Sep. 20, 1999

Related U.S. Application Data

(62) Division of application No. 09/281,735, filed on Mar. 30, 1999, now Pat. No. 5,990,559, which is a division of application No. 09/141,840, filed on Aug. 27, 1998.

(51) Int. Cl.[7] .............................. B01J 23/42; B01J 23/44; B01J 21/08; B01J 21/12; B01J 21/14
(52) U.S. Cl. ......................... 502/339; 502/261; 502/262
(58) Field of Search ................................. 502/339, 261, 502/262

(56) References Cited

U.S. PATENT DOCUMENTS

| | | | |
|---|---|---|---|
| 3,856,709 | * 12/1974 | Porta et al. | 502/178 |
| 3,975,304 | * 8/1976 | Porta et al. | 502/527.24 |
| 4,341,662 | * 7/1982 | Pfefferle | 502/201 |
| 4,425,261 | * 1/1984 | Stenius et al. | 502/339 |
| 4,431,750 | * 2/1984 | McGinnis et al. | 502/329 |
| 4,714,693 | * 12/1987 | Targos | 502/261 |
| 4,719,442 | * 1/1988 | Bohara et al. | 338/25 |
| 5,053,917 | 10/1991 | Miyasaka et al. | 361/321 |
| 5,208,479 | 5/1993 | Mathews et al. | 257/134 |
| 5,320,978 | 6/1994 | Hsu | 437/192 |

(List continued on next page.)

FOREIGN PATENT DOCUMENTS

| | | |
|---|---|---|
| 0 415 751 | 3/1991 | (EP) . |
| 0 855 738 | 7/1998 | (EP) . |
| 5-67730 | 2/1991 | (JP) . |
| 9-82666 | 3/1997 | (JP) . |

OTHER PUBLICATIONS

Kwan, J. et al., "Characterization of Pt Thin Films Deposited by Metallorganic Chemical Vapor Deposition for Ferroelectric Bottom Electrodes", J. Electrochem. Soc., vol. 144, No. 8, Aug. 1997, pp. 2848–2854.

Ino, M. et al., "Rugged Surface Polycrystalline Silicon Film Deposition and Its Application in a Stacked Dynamic Random Access Memory Capacitor Electrode", J.Vac. Sci. Technol., B 14(2), Mar./Apr. 1996, pp. 751–756.

*Primary Examiner*—Mark L. Bell
*Assistant Examiner*—Patricia L. Hailey
(74) *Attorney, Agent, or Firm*—Wells, St. John, Roberts, Gregory & Matkin, P.S.

(57) ABSTRACT

In one aspect, the invention includes a method of forming a roughened layer of platinum, comprising: a) providing a substrate within a reaction chamber; b) flowing an oxidizing gas into the reaction chamber; c) flowing a platinum precursor into the reaction chamber and depositing platinum from the platinum precursor over the substrate in the presence of the oxidizing gas; and d) maintaining a temperature within the reaction chamber at from about 0° C. to less than 300° C. during the depositing. In another aspect, the invention includes a platinum-containing material, comprising: a) a substrate; and b) a roughened platinum layer over the substrate, the roughened platinum layer having a continuous surface characterized by columnar pedestals having heights greater than or equal to about one-third of a total thickness of the platinum layer.

16 Claims, 2 Drawing Sheets

U.S. PATENT DOCUMENTS

| | | | |
|---|---|---|---|
| 5,330,700 | * | 7/1994 | Soukup et al. ............................. 419/2 |
| 5,525,570 | * | 6/1996 | Chakraborty et al. ................ 502/326 |
| 5,639,685 | * | 6/1997 | Zahurak et al. ...................... 438/658 |
| 5,763,286 | | 6/1998 | Figura et al. .......................... 437/60 |
| 5,783,716 | | 7/1998 | Baum et al. ......................... 556/136 |
| 5,796,648 | | 8/1998 | Kawakubo et al. .................. 365/145 |
| 5,874,364 | | 2/1999 | Nakabayashi et al. .............. 438/738 |
| 5,917,213 | * | 6/1999 | Iyer et al. ............................. 257/309 |
| 5,990,559 | * | 11/1999 | Marsh .................................. 257/768 |
| 6,033,953 | | 3/2000 | Aoki et al. ........................... 438/255 |

* cited by examiner

PLATINUM-CONTAINING MATERIALS AND CATALYSTS

RELATED PATENT DATA

This patent is a divisional application of U.S. patent application Ser. No. 09/281,735, now U.S. Pat. No. 5,990,559 which was filed on Mar. 30, 1999; and which is a divisional application of U.S. patent application Ser. No. 09/141,840, which was filed on Aug. 27, 1998.

TECHNICAL FIELD

The invention pertains to methods of forming and using platinum-containing materials, and to circuitry incorporating roughened layers of platinum.

BACKGROUND OF THE INVENTION

Platinum is a candidate for utilization as a conductive material in advanced semiconductor processing. Platinum can be utilized in an elemental form, or as an alloy (such as, for example, rhodium/platinum), and can be deposited onto a substrate by, for example, sputter deposition or chemical vapor deposition (CVD) methods. Platinum is typically formed to have a relatively smooth upper surface. Such smooth upper surface can be advantageous in, for example, applications in which circuitry is formed over the platinum layer. Specifically, the relatively smooth surface can provide a substantially planar platform upon which other circuitry is formed. However, there can be advantages to incorporating roughened conductive layers into integrated circuitry in applications where high surface area is desired, as with capacitor electrodes. Accordingly, it would be desirable to develop methods of forming platinum layers having roughened outer surfaces.

In another aspect of the prior art, platinum-comprising materials are frequently utilized as catalysts in, for example, the petroleum industry, as well as in, for example, automobile exhaust systems. Frequently, an efficiency of a catalyst can be improved by enhancing a surface area of the catalyst. Accordingly, it would be desirable to develop methods of enhancing surface area of platinum-comprising materials.

SUMMARY OF THE INVENTION

In one aspect, the invention encompasses a method of forming a roughened layer of platinum. A substrate is provided within a reaction chamber. An oxidizing gas is flowed into the reaction chamber, and a platinum precursor is flowed into the chamber. Platinum is deposited from the platinum precursor over the substrate in the presence of the oxidizing gas. A temperature within the chamber is maintained at from about 0° C. to less than 300° C. during the depositing.

In another aspect, the invention encompasses a circuit comprising a roughened platinum layer over a substrate. The roughened platinum layer has a continuous surface characterized by columnar pedestals.

In yet another aspect, the invention encompasses a platinum catalyst characterized by a continuous outer surface portion of the platinum having a plurality of columnar pedestals that are at least about 400 Å tall. The surface portion covers an area that is at least about $4 \times 10^6$ square Angstroms.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
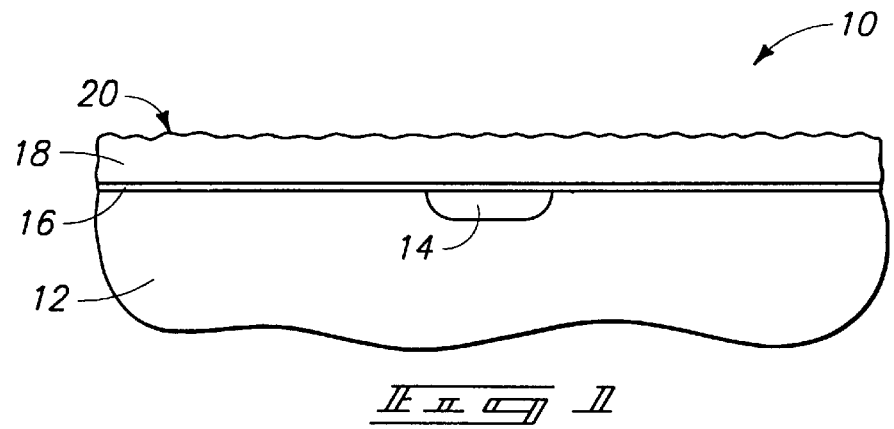
FIG. 1 is a diagrammatic, fragmentary, cross-sectional view of a semiconductive wafer fragment processed according to a method of the present invention.

The invention encompasses methods of forming platinum layers having roughened outer surfaces, and methods of incorporating such layers into capacitor constructions. FIG. 1 shows a semiconductor wafer fragment 10 at a preliminary processing step of the present invention. Wafer fragment 10 comprises a substrate 12. Substrate 12 can comprise, for example, a monocrystalline silicon wafer lightly doped with a background p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A diffusion region 14 is formed within substrate 12 and defines a node location to which electrical connection with a storage node of a capacitor is to be made. Diffusion region 14 can be formed by, for example, implanting a conductivity enhancing dopant into substrate 12.

An adhesion layer 16 is formed over substrate 12 and in electrical contact with diffusion region 14, and a platinum-comprising layer 18 is formed over adhesion layer 16. Adhesion layer 16 is provided to enhance adhesion of platinum-comprising layer 18 to substrate 12. In other embodiments (not shown) a platinum-comprising layer can be provided directly onto a silicon surface (either the monocrystalline silicon surface of substrate 12, or an intervening amorphous or polycrystalline surface). Such embodiments are less preferred than the shown embodiment due to difficulties of adequately adhering platinum directly to silicon.

Adhesion layer 16 can comprise, for example, at least one of titanium nitride, iridium, rhodium, ruthenium, platinum, palladium, osmium, silver, rhodium/platinum alloy, IrO$_2$, RuO$_2$, RhO$_2$, or OsO$_2$. Adhesion layer 16 can be formed by, for example, chemical vapor deposition, and can be formed to a thickness of, for example, less than 100 Å.

Platinum-comprising layer 18 can comprise, for example, elemental platinum, or a platinum alloy, such as rhodium/platinum alloy. Platinum-comprising layer 18 is provided to have a roughened outer surface 20. Such can be accomplished by chemical vapor deposition of platinum-comprising layer 18 under relatively low temperature conditions, and in the presence of an oxidizing atmosphere. For instance, a platinum-comprising layer 18 formed as follows will comprise a roughened outer surface 20.

First, substrate 12 is inserted within a CVD reaction chamber. An oxidizing gas and a platinum precursor are flowed into the reaction chamber. Platinum is deposited from the platinum precursor over substrate 12 in the presence of the oxidizing gas. A temperature within the reaction chamber is maintained at from about 0° C. to less than 300° C. during the depositing, and a pressure within the reactor is preferably maintained at from about 0.5 Torr to about 20 Torr. Suitable control of the temperature and of a relative flow rate of the oxidizing gas to the platinum precursor causes deposited platinum layer 18 to have a roughened outer surface 20. The platinum precursor is flowed into the reaction chamber in a carrier gas, such as, for example, a gas known to be generally inert to reaction with platinum precursor materials, such as, for example, helium or argon. The platinum precursor can comprise, for example, at least one of $MeCpPtMe_3$, $CpPtMe_3$, $Pt(acetylacetonate)_2$, $Pt(PF_3)_4$, $Pt(CO)_2Cl_2$, cis-$[PtMe_2(MeNC)_2]$, or platinum hexafluoroacetylacetonate; wherein Cp is a cyclopentadienyl group and Me is a methyl group. The oxidizing gas can comprise, for example, at least one of $O_2$, $N_2O$, $SO_3$, $O_3$, $H_2O_2$, or $NO_x$, wherein x has a value of from 1 to 3. In embodiments wherein platinum layer 18 comprises a platinum/metal alloy, at least one other metal precursor can be flowed into the reaction chamber to deposit the platinum as an alloy of the platinum and the at least one other metal. The at least one other metal precursor can comprise, for example, a precursor of rhodium, iridium, ruthenium, palladium, osmium, and/or silver.

The oxidizing gas can assist in deposition of platinum from the platinum-comprising precursor by oxidizing carbon from the precursor during deposition of the platinum. Also, the oxidizing gas can influence a deposition rate of a platinum-comprising layer. Specifically, a greater rate of flow of the oxidizing gas relative to the flow of the platinum precursor can lead to faster deposition of the platinum-comprising layer. The rate of flow of platinum precursor is influenced by a rate of flow of carrier gas through a liquid organic precursor solution, and by a temperature of the precursor solution. In preferred embodiments of the invention, a carrier gas will be flowed through a liquid organic precursor solution at a rate of from about 2 sccm to about 1000 sccm and more preferably at less than or equal to about 30 sccm. In such preferred embodiments, the oxidizing gas will be flowed at a flow rate of at least about 50 sccm. The organic precursor will preferably be at a temperature of from about 0° C. to about 100° C., and more preferably from about 30° C. to about 50° C.

A rate of growth of platinum-comprising layer within the reaction chamber is also influenced by a temperature of the substrate. Specifically, if platinum is deposited under conditions wherein the temperature of the substrate is maintained at from about 220° C. to less than 300° C., the platinum will deposit at a rate of about 600 Å in about 30 seconds. If a temperature of the substrate is reduced to below about 210° C., a rate of deposition of platinum will decrease considerably. It is preferred that a deposition time for a 600 Å thick platinum-comprising layer be less than or equal to about 40 seconds to maintain efficiency of a production process. Accordingly, it is preferred that the temperature of the substrate be maintained at above about 210° C., and preferably at from greater than or equal to about 220° C. during deposition of the platinum-comprising layer within the reaction chamber.

It is also found that if a temperature is greater than 300° C. and less than about 350° C., a deposited platinum layer will have a smooth outer surface, rather than a desired roughened outer surface. Further, if the temperature of the substrate exceeds about 400° C., a deposited platinum surface will have holes extending to a surface underlying the platinum surface, rather than being a continuous surface overlying a substrate. Accordingly, it is preferred that the temperature of the substrate be well below 400° C., more preferred that the temperature be below 300° C., and even more preferred that the temperature be less than or equal to about 280° C. In preferred embodiments of the present invention, the temperature of the substrate will be maintained at from about 220° C. to about 280° C., whereupon it is found that a platinum layer having a roughened outer surface can be deposited to a thickness of about 600 Å in about 30 seconds.

Platinum layer 18 is preferably deposited to a thickness of at least about 400 Å to avoid having surface anomalies (such as crevices or holes) that extend entirely through layer 18 to an underlying layer, and is preferably deposited to a thickness of at least about 600 Å. However, in some embodiments holes extending entirely through layer 18 will be of little or no consequence in semiconductor circuitry ultimately formed from layer 18. Such embodiments can include, for example, embodiments wherein adhesion layer 16 is provided beneath platinum-comprising layer 18. Accordingly, in embodiments wherein platinum layer 18 is provided over an adhesion layer 16, it can be preferred to provide platinum layer 18 to a thickness of less than 400 Å because of space limitations due to the close packing of capacitors. Also, in embodiments in which platinum layer 18 is utilized in forming circuitry having tight spacing requirements it can be preferred to form layer 18 to be relatively thin. For instance, in some capacitor constructions it can be desired to form layer 18 to be less than or equal to about 1000 Å, and more preferred to form layer 18 to be from about 300 Å to about 400 Å to avoid electrical contact between adjacent capacitor structures.

Figure 2:
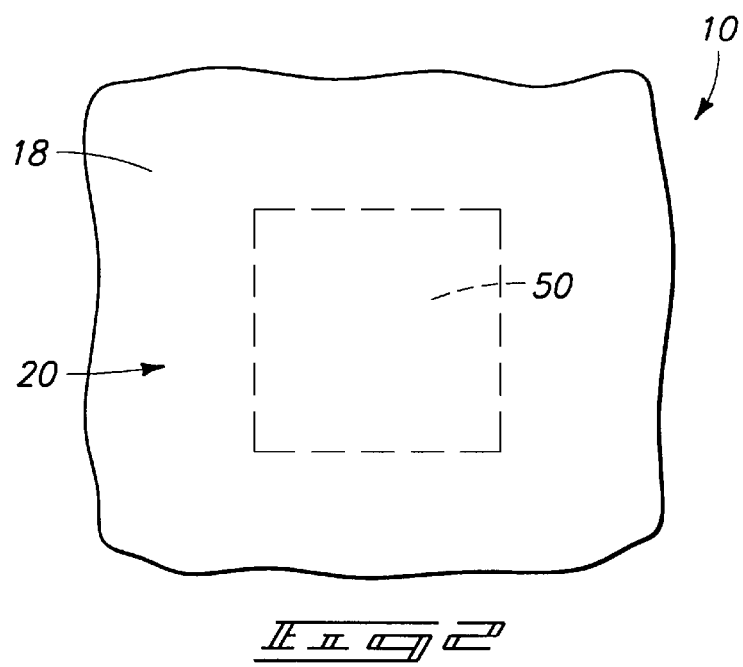
FIG. 2 is a fragmentary top view of the semiconductor wafer fragment of FIG. 1.

A fragmentary top view of wafer fragment 10 is shown in FIG. 2. Layer 18 is preferably a continuous layer (defined as a layer without cavities extending therethrough to an underlying layer—such as the underlying layer 16 of FIG. 2) across its entirety. Alternatively, some portion of layer 18 is continuous. For example, consider an application where layer 18 overlies and contacts a conductive layer to form a circuit device comprising both layer 18 and the underlying conductive layer. In such applications, it is generally still desired that a substantial portion of layer 18 be continuous to, for example, maintain a uniform electrical contact between layer 18 and the underlying conductive layer. Such substantial portion will preferably cover a surface area of at least about $4 \times 10^6$ square Angstroms. A surface area of about $4 \times 10^6$ square Angstroms is illustrated in FIG. 3 as a square 50 having sides of about 2000 Angstroms.

Figure 3:
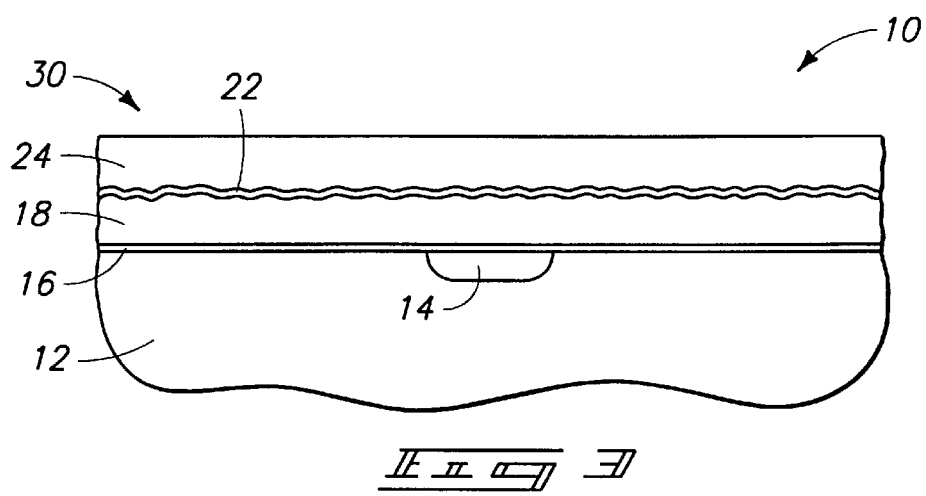
FIG. 3 is a view of the FIG. 1 wafer fragment at a processing step subsequent to that of FIG. 1.

FIG. 3 illustrates an embodiment wherein platinum-comprising layer 18 is incorporated into a capacitor construction 30 as a storage node. Specifically, a dielectric layer 22 and a capacitor electrode 24 are provided over platinum-comprising layer 18 to form capacitor construction 30. Dielectric layer 22 can comprise one or more of silicon oxide or silicon nitride, or it can comprise other dielectric materials, such as, for example, tantalum pentoxide, or $BaSrTiO_3$. Capacitor electrode 24 can comprise, for example, TiN, conductively doped silicon (such as polysilicon), or a metal, such as, for example, platinum. In embodiments wherein capacitor electrode 24 comprises platinum, capacitor electrode 24 can be formed by chemical vapor deposition over dielectric layer 22. The chemical vapor deposition can be conducted either to form upper electrode 24 with a relatively smooth upper surface, or to form upper electrode 24 with a relatively rough upper surface. If capacitor electrode 24 is to be formed of platinum with a relatively smooth upper surface, it can be chemical vapor deposited in a reaction chamber with a temperature maintained at above about 300° C. and/or with an oxidizing gas flow rate of less than 50 sccm and a carrier gas flow rate of greater than 30 sccm. Also, any platinum comprised by capacitor electrode 24 can be in the form of elemental platinum, or an alloy, such as, for example, rhodium/platinum alloy.

As shown, layer 18 has a rough outer surface and layers 22 and 24 are conformal to the rough outer surface of layer 18.

Figure 4:
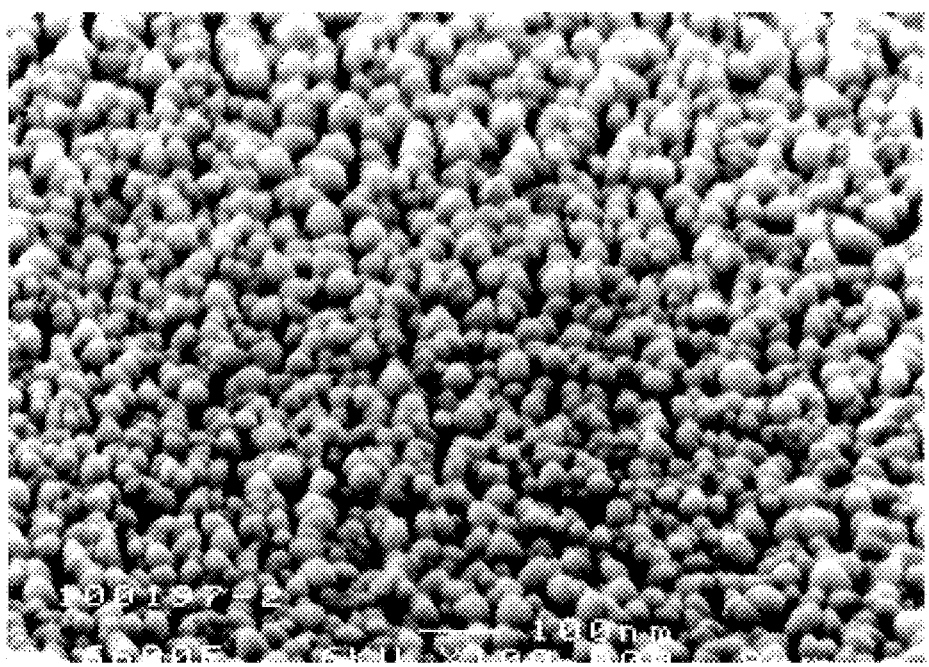
FIG. 4 is a scanning electron microscope (SEM) micrograph of a platinum film produced by CVD of MeCpPt(Me)$_3$.
Figure 5:
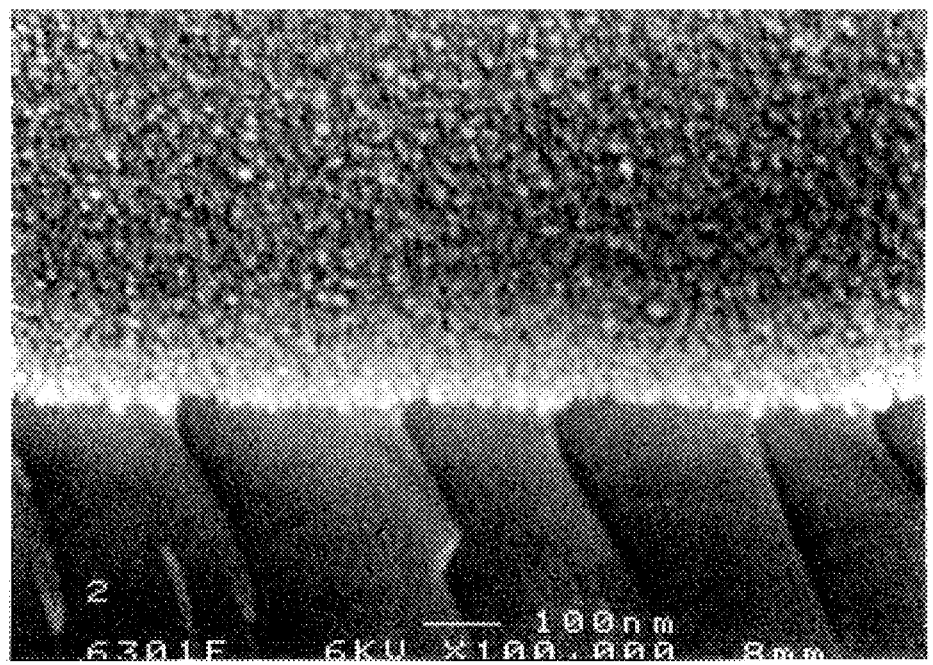
FIG. 5 is a SEM micrograph of a platinum film produced by CVD of MeCpPt(Me)$_3$ under different conditions than those utilized for forming the film of FIG. 4.

FIGS. 4 and 5 illustrate scanning electron microscope (SEM) micrographs of platinum films produced by CVD of MeCpPt(Me)$_3$. FIG. 4 illustrates a surface produced within a reaction chamber in a time of about 6 minutes, wherein a temperature in the chamber was about 215° C., a pressure was about 5 Torr, a flow rate of carrier gas (He, with a pressure at the carrier gas bubbler of about 6 Torr) was about 5 sccm, and a flow rate of oxidizing gas (O$_2$) was about 50 sccm. The platinum surface formed comprises pedestals characteristic of columnar growth. The columnar pedestals terminate in dome-shaped (substantially hemispherical) tops. It can be advantageous to have substantially hemispherical tops, rather than tops having sharp edges, in forming capacitor constructions or other electronic circuitry from a deposited platinum layer. Specifically, the relatively rounded hemispherical surfaces can create relatively uniform electric fields at the surface of a deposited platinum layer. In contrast, if sharp edges were present, the sharp edges could form loci for high electric fields, and lead to leakage of electric current across the capacitor. The platinum layer illustrated in FIG. 4 can be referred to as "hemispherical grain" platinum to indicate a structure largely analogous to a material known in the art as hemispherical grain polysilicon.

The platinum layer of FIG. 4 is characterized by columnar pedestals generally having heights greater than or equal to about one-third of a total thickness of the platinum layer. Many of the pedestals shown in FIG. 4 have a height approximately equal to a thickness of the deposited platinum layer. Accordingly, if the deposited platinum layer has a thickness of about 600 Å, the individual pedestals can have a thickness approaching 600 Å. Such is only an approximation to the size of the pedestals as it is found that some of the pedestals will grow from surfaces of other pedestals, and some of the pedestals will grow less vertically than other pedestals. An average diameter of the pedestals is about 200 Å, and the pedestals are generally closely packed (i.e., the pedestals generally touch other pedestals and many pedestals fuse with other pedestals), but the distribution of the pedestals is typically not a close-packed structure (i.e., a structure wherein all the pedestals are tightly packed in, for example, an hexagonal type arrangement to form a maximum number of pedestals on a given surface). The columnar growth illustrated in FIG. 4 is found not to occur if a temperature within a CVD reaction chamber is above 300° C.

FIG. 5 illustrates a surface produced on a platinum film within a reaction chamber in a time of about 150 seconds, wherein a temperature in the chamber was 300° C., a pressure was about 0.5 Torr, a flow rate of carrier gas (He, with a pressure at the carrier gas bubbler of about 6 Torr) was about 30 sccm, and a flow rate of oxidizing gas (O$_2$) was about 10 sccm. The platinum layer deposited under the FIG. 5 conditions has a much smoother surface than that deposited under the FIG. 4 conditions. FIGS. 4 and 5 together evidence that it is possible to control a grain structure of a surface of a chemical vapor deposited platinum layer by controlling process parameters of a chemical vapor deposition reaction chamber.

Although the invention has been described with application to formation of a capacitor structure, it is to be understood that the invention can be utilized in a number of other applications as well. For instance, a platinum layer having a roughened surface can be utilized for formation of catalysts.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A reaction catalyst comprising hemispherical grain platinum.

2. A reaction catalyst characterized by an outer surface portion of platinum comprising a plurality of columnar pedestals that are at least about 100 Å tall, and wherein the platinum comprises hemispherical grain platinum.

3. A platinum-comprising material, comprising:
   a silicon-comprising substrate having a conductively-doped diffusion region extending therein;
   a roughened platinum layer over the substrate and in electrical contact with the diffusion region, the roughened platinum layer having a continuous surface characterized by columnar pedestals having heights greater than or equal to about one-third of a total thickness of the roughened platinum layer; and
   an adhesion layer between the roughened platinum layer and the silicon-comprising substrate, the adhesion layer comprising at least one of titanium nitride, iridium, rhodium, ruthenium, platinum, palladium, osmium, and silver.

4. The platinum-comprising material of claim 3 wherein the adhesion layer comprises at least one of rhodium/platinum alloy, IrO$_2$, RuO$_2$, RhO$_2$, and OsO$_2$.

5. The platinum-comprising material of claim 3 wherein the roughened platinum layer is in the form of hemispherical grain platinum.

6. The platinum-comprising material of claim 3 wherein the substrate comprises monocrystalline silicon.

7. A platinum-containing material, comprising:
   a substrate;
   an adhesion layer over the substrate, the adhesion layer comprising at least one of titanium nitride, iridium, rhodium, ruthenium, palladium, osmium, and silver; and
   a roughened platinum layer on the adhesion layer.

8. The platinum-comprising material of claim 7 wherein the roughened platinum layer is in the form of hemispherical grain platinum.

9. The platinum-comprising material of claim 7 further comprising an electrical node within the substrate and wherein the roughened platinum layer is electrically connected to the electrical node through the adhesion layer.

10. A platinum-containing structure, comprising:

a semiconductive substrate;

a roughened platinum mass over the substrate, the roughened platinum mass having a continuous surface characterized by columnar pedestals having heights greater than or equal to about one-third of a total thickness of the roughened platinum mass; and a layer between the roughened platinum mass and the substrate, and against both the roughened platinum mass and the substrate; the layer comprising at least one of titanium nitride, iridium, rhodium, ruthenium, platinum, palladium, osmium, and silver.

11. The structure of claim 10 wherein the layer comprises at least one of rhodium/platinum alloy, $IrO_2$, $RuO_2$, $RhO_2$, and $OsO_2$.

12. The structure of claim 10 wherein the layer comprises rhodium/platinum alloy.

13. The structure of claim 10 wherein the layer comprises $IrO_2$.

14. The structure of claim 10 wherein the layer comprises $RuO_2$.

15. The structure of claim 10 wherein the layer comprises $RhO_2$.

16. The structure of claim 10 wherein the layer comprises $OsO_2$.

* * * * *